US010763263B2

United States Patent
Ota

(10) Patent No.: US 10,763,263 B2
(45) Date of Patent: Sep. 1, 2020

(54) SEMICONDUCTOR DEVICE HAVING EQUIVALENT SERIES RESISTANCE UNIT

(71) Applicant: MICRON TECHNOLOGY, INC., Boise, ID (US)

(72) Inventor: Ken Ota, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/262,700

(22) Filed: Jan. 30, 2019

(65) Prior Publication Data

US 2020/0243542 A1   Jul. 30, 2020

(51) Int. Cl.
| H01L 27/108 | (2006.01) |
| H01L 23/522 | (2006.01) |
| H01L 23/532 | (2006.01) |
| H01L 23/528 | (2006.01) |

(52) U.S. Cl.
CPC ...... *H01L 27/10897* (2013.01); *H01L 23/528* (2013.01); *H01L 23/5223* (2013.01); *H01L 23/5228* (2013.01); *H01L 23/53257* (2013.01)

(58) Field of Classification Search
CPC ......... H01L 27/10897; H01L 23/53257; H01L 23/5228; H01L 23/528; H01L 23/5223

USPC ...................................................... 257/296
See application file for complete search history.

(56) References Cited

U.S. PATENT DOCUMENTS

| 7,557,400 | B2 * | 7/2009 | Wada | .................. | H01L 23/5223 |
| | | | | | 257/307 |
| 7,579,904 | B2 * | 8/2009 | Im | .......................... | G11C 5/14 |
| | | | | | 327/540 |
| 7,838,919 | B2 * | 11/2010 | Okamoto | ............... | H01G 4/005 |
| | | | | | 257/307 |
| 7,939,910 | B2 * | 5/2011 | Cho | ..................... | H01L 23/5223 |
| | | | | | 257/306 |

* cited by examiner

*Primary Examiner* — Vu A Vu
(74) *Attorney, Agent, or Firm* — Dorsey & Whitney LLP

(57) ABSTRACT

Disclosed herein is an apparatus that includes: a first conductive layer having a first common pattern and a plurality of first branch patterns arranged in a first direction, one end of each of the first branch patterns being connected to the first common pattern; a second conductive layer having a second common pattern and a plurality of second branch patterns arranged in the first direction, one end of at least one of the second branch patterns being connected to the second common pattern; an insulating layer formed between the first and second conductive layers; and a plurality of via electrodes penetrating through the insulating layer, other end of each of the first branch patterns being connected to an associated one of other end of each of the second branch patterns.

19 Claims, 10 Drawing Sheets

SEMICONDUCTOR DEVICE HAVING EQUIVALENT SERIES RESISTANCE UNIT

BACKGROUND

Some semiconductor devices include an ESR (Equivalent Series Resistance) unit for stabilizing an internal voltage. The frequency characteristics of the ESR unit are varied by a resistance value thereof. Therefore, the resistance value of the ESR unit is finely adjusted in a design stage of a semiconductor device. As a method of finely adjusting the resistance value of the ESR unit, there is considered a method of changing a length of a path that passes through a high-resistance conductor layer. However, in this method, it is necessary to concentrate a large-area wiring pattern connected to a number of capacitors to one place once, and to connect the wiring pattern to an end of a resistor pattern formed by the high-resistance conductor layer. In this case, a resistance component that cannot be igored is added in a portion where the large-area wiring pattern is concentrated, and it is therefore difficult to adjust the resistance value of the ESR unit as designed. Accordingly, an ESR unit having a configuration that allows correct adjustment of a resistance value as designed is demanded.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
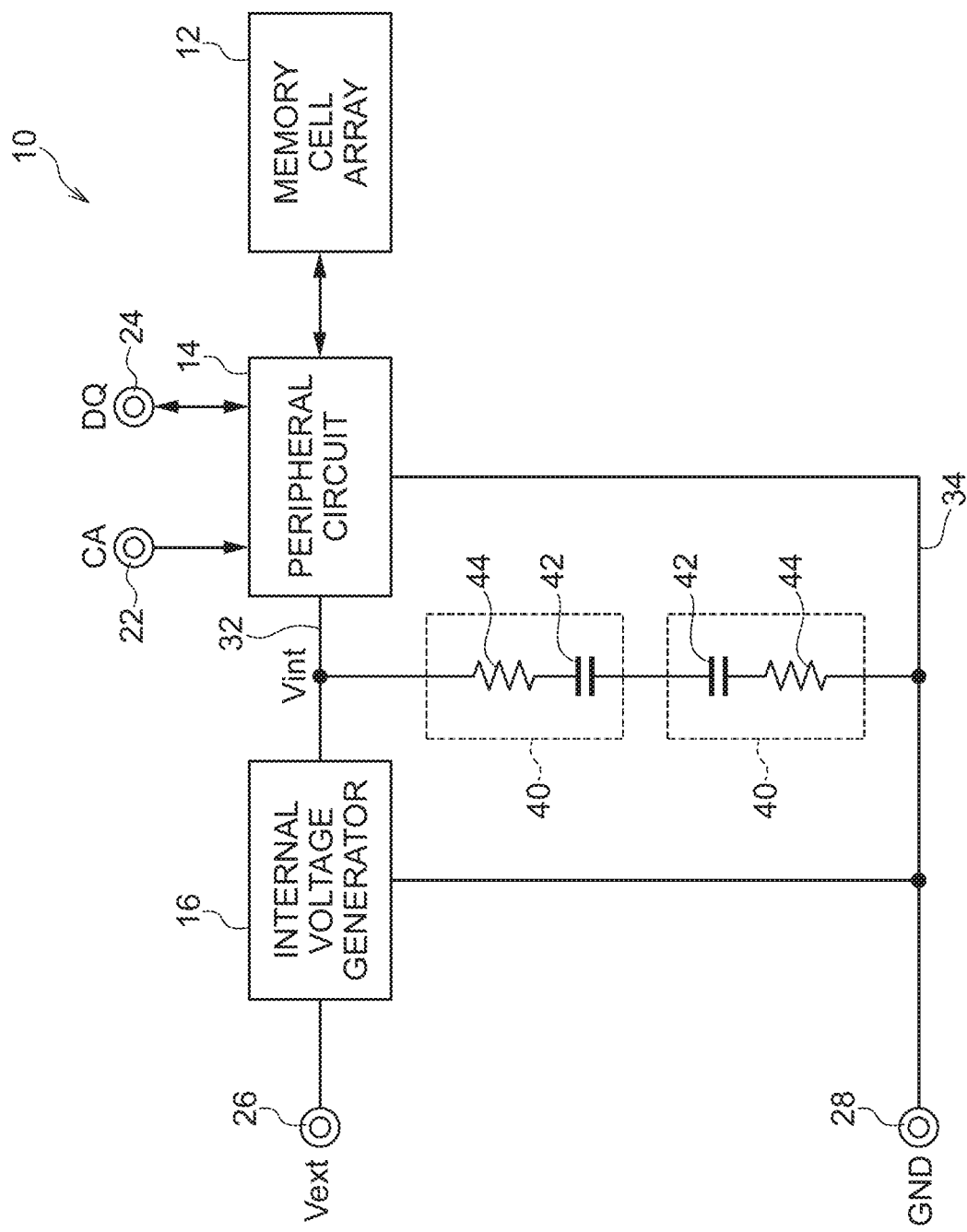
FIG. 1 is a block diagram showing an example of a semiconductor device according to the present disclosure.
Figure 2:
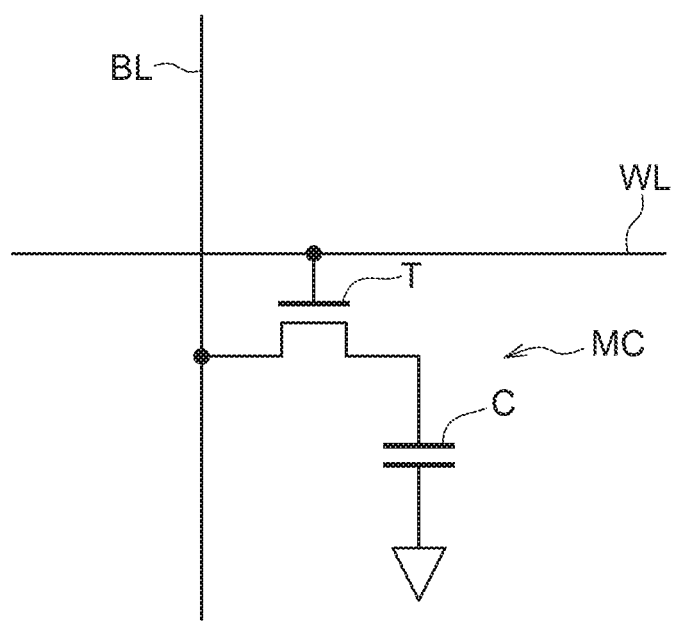
FIG. 2 is a circuit diagram of a memory cell.

A semiconductor device 10 according to the present disclosure is a DRAM, and includes a memory cell array 12, a peripheral circuit 14, and an internal voltage generating circuit 16, as shown in FIG. 1. The memory cell array 12 is formed by a number of memory cells arranged in an array. As shown in FIG. 2, the memory cell array 12 includes memory cells MC respectively arranged at intersections of bit lines BL and word lines WL. The memory cell MC is a DRAM cell, and has a configuration in which a cell transistor T and a cell capacitor C are connected to each other in series. An access to the memory cell array 12 is made by the peripheral circuit 14. The peripheral circuit 14 performs a read operation or a write operation for the memory cell array 12 based on a command address signal CA supplied from outside via a command address terminal 22. The peripheral circuit 14 outputs data DQ read from the memory cell array 12 to the outside from a data terminal 24 in the read operation, and writes data DQ supplied from the outside to the data terminal 24 into the memory cell array 12 in the write operation.

The peripheral circuit 14 operates by a voltage between an internal power-supply potential Vint supplied to an internal power-supply line 32 and a ground potential GND supplied to an internal power-supply line 34. The internal power-supply potential Vint is generated by the internal voltage generating circuit 16. The internal voltage generating circuit 16 receives an external power-supply potential Vext supplied from the outside via a power-supply terminal 26 and the ground potential GND supplied from the outside via a ground terminal 28, and generates the internal power-supply potential Vint based on those potentials. The external power-supply potential Vext is made stable by a decoupling capacitor (not shown) provided outside the semiconductor device 10. Meanwhile, the internal power-supply potential Vint generated by the internal voltage generating circuit 16 is made stable by the ESR unit 40 connected between the internal power-supply lines 32 and 34. The ESR unit 40 has a function of absorbing power-supply noise superimposed on the internal power-supply potential Vint by an operation of the peripheral circuit 14. In the example shown in FIG. 1, two ESR units 40 are connected in series between the internal power-supply lines 32 and 34. The ESR unit 40 has a configuration in which a resistance component 42 and a capacitance component 44 are connected in series. The frequency characteristics of the ESR unit 40 are finely adjusted by the resistance component 42.

Figure 3:
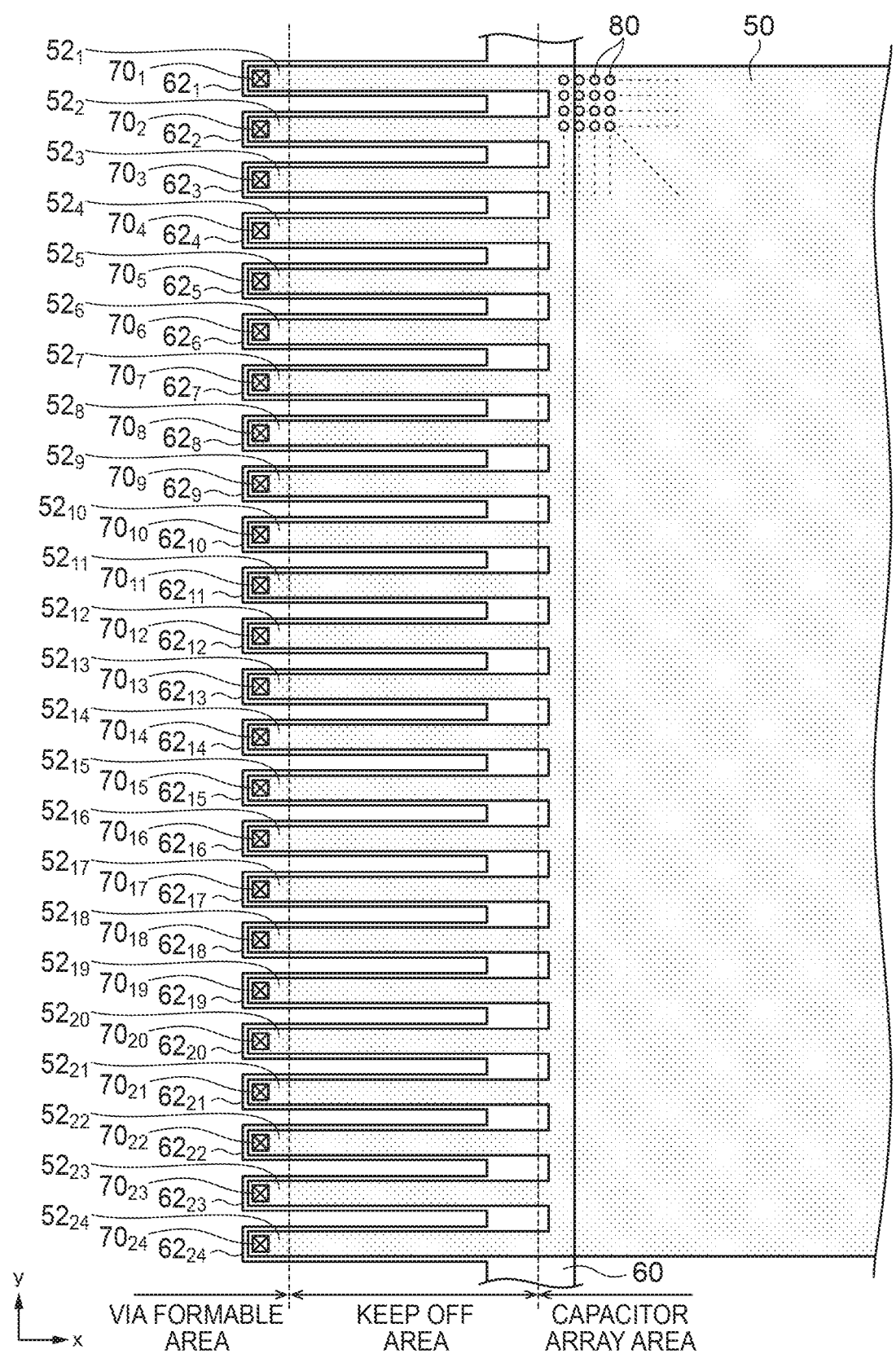
FIG. 3 is a schematic plan view for explaining a configuration of an ESR unit.

FIG. 3 is a schematic plan view for explaining the configuration of the ESR unit 40. As shown in FIG. 3, the ESR unit 40 includes a first common pattern 50 and a plurality of first branch patterns $52_1$ to $52_{24}$ formed in a lower wiring layer and a second common pattern 60 and a plurality of second branch patterns $62_1$ to $62_{24}$ formed in an upper wiring layer. The lower wiring layer is made of a refractory metal, such as tungsten, and the upper wiring layer is made of a low-resistance metal, such as aluminum or copper. The first common pattern 50 is connected to lower electrodes of a plurality of capacitor elements 80 in common. The capacitor elements 80 are elements configuring the capacitance component 44 shown in FIG. 1, and have substantially the same configuration as the cell capacitor C configuring the memory cell MC.

The first branch patterns $52_1$ to $52_{24}$ all extend in the x-direction. In the example shown in FIG. 3, 24 first branch patterns $52_1$ to $52_{24}$ are arranged in the y-direction. The first branch patterns $52_1$ to $52_{24}$ are elements configuring the resistance component 42 shown in FIG. 1. One ends of the first branch patterns $52_1$ to $52_{24}$ in the x-direction are all connected to the first common pattern 50. The other ends of the first branch patterns $52_1$ to $52_{24}$ in the x-direction are respectively connected to lower ends of associated via conductors $70_1$ to $70_{24}$. The second branch patterns $62_1$ to $62_{24}$ all extend in the x-direction. In the example shown in FIG. 3, 24 second branch patterns $62_1$ to $62_{24}$ are arranged in the y-direction, and have portions overlapping on the associated first branch patterns $52_1$ to $52_{24}$ in plan view, respectively One ends of the second branch patterns $62_1$ to $62_{24}$ in the x-direction are all connected to the second common pattern 60. The other ends of the second branch patterns $62_1$ to $62_{24}$ in the x-direction are respectively connected to upper ends of the associated via conductors $70_1$ to $70_{24}$. With this configuration, the first branch patterns $52_1$ to $52_{24}$ and the second branch patterns $62_1$ to $62_{24}$ are short-circuited to each other via the associated via conductors $70_1$ to $70_{24}$, respectively. As a result, the first common pattern 50 and the second common pattern 60 are connected to each other, and a resistance value therebetween is a value determined by the first branch patterns $52_1$ to $52_{24}$. Because resistance values of the second branch patterns $62_1$ to $62_{24}$ are sufficiently lower than resistance values of the first branch patterns $52_1$ to $52_{24}$, the resistance values of the second branch patterns $62_1$ to $62_{24}$ can be ignored.

The ESR unit 40 is arranged in a peripheral-circuit area where the peripheral circuit 14 shown in FIG. 1 is arranged. Among the components of the ESR unit 40, the first common pattern 50 and the capacitor elements 80 are arranged in a capacitor array area in the peripheral-circuit area. The capacitor array area is an area where the capacitor elements 80 are arranged. The via conductors $70_1$ to $70_{24}$ are arranged in a via formable area in the peripheral-circuit area. As shown in FIG. 3, there is a KEEP-OFF area between the capacitor array area and the via formable area. The KEEP-OFF area is an area that does not allow a via conductor to be arranged.

Figure 4:
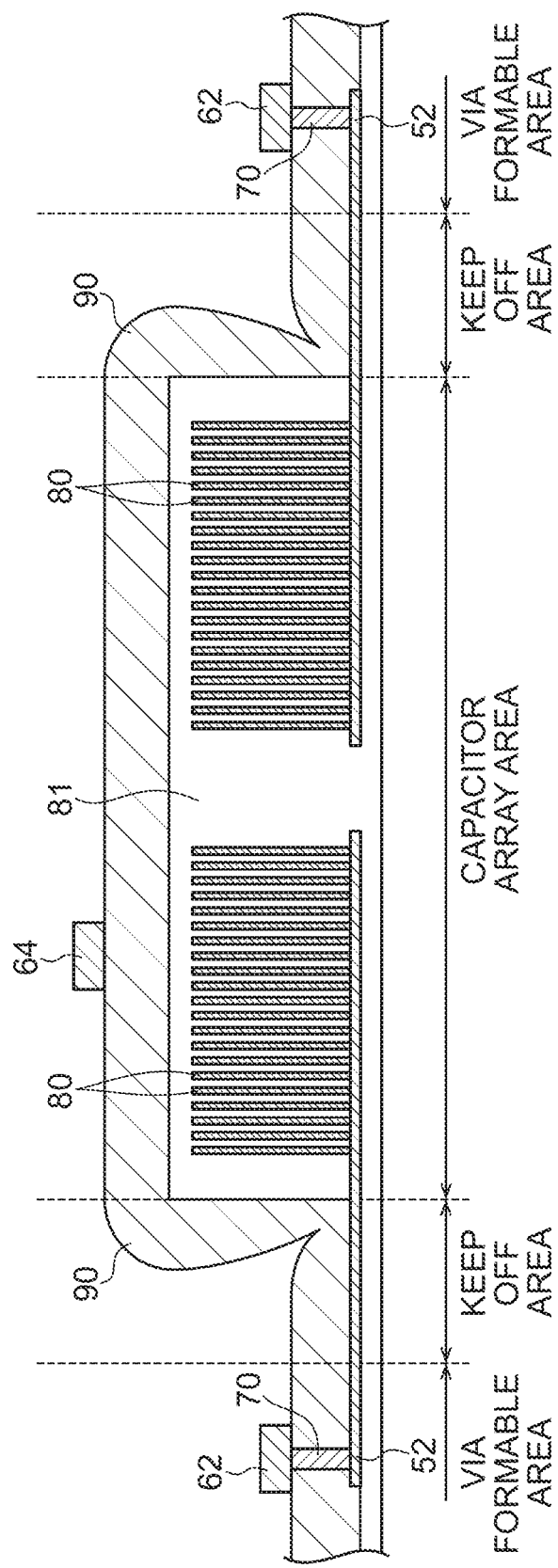
FIG. 4 is a schematic cross-sectional view of the two ESR units connected in series.

FIG. 4 is a schematic cross-sectional view of the two ESR units 40 connected in series. As shown in FIG. 4, the first common pattern 50 is separated into two in the capacitor array area. Half of the capacitor elements 80 arranged in the capacitor array area are connected at lower electrodes thereof to one of the first common patterns 50. The remaining half of the capacitor elements 80 arranged in the capacitor array area are connected at lower electrodes thereof to the other first common pattern 50. Further, upper electrodes of these capacitor elements 80 are all connected in common via a plate electrode 81. Because a number of cell capacitors C are arranged in the capacitor array area in this manner, a large step is generated between the capacitor array area and the via formable area. Therefore, when an interlayer insulating film 90 that covers the capacitor array area and the via formable area is formed, flatness of the interlayer insulating film 90 is not ensured in the vicinity of the step. Because it is difficult to form a via conductor in a portion where the interlayer insulating film 90 is not flat, this portion is defined as the KEEP-OFF area where any via conductor cannot be arranged. In the semiconductor device 10 according to the present disclosure, the via conductor 70 penetrating through the interlayer insulating film 90 is arranged in the via formable area, thereby connecting the other ends of the first branch patterns 52 and the other ends of the second branch patterns 62. Another pattern 64 configuring the upper wiring layer is also arranged in the capacitor array area.

In the example shown in FIG. 3, the first common pattern 50 and the second common pattern 60 are connected to each other via the 24 first branch patterns $52_1$ to $52_{24}$. Therefore, when each of the resistance values of the first branch patterns $52_1$ to $52_{24}$ is defined as A, a value of the resistance component 42 is A/24.

Figure 5:
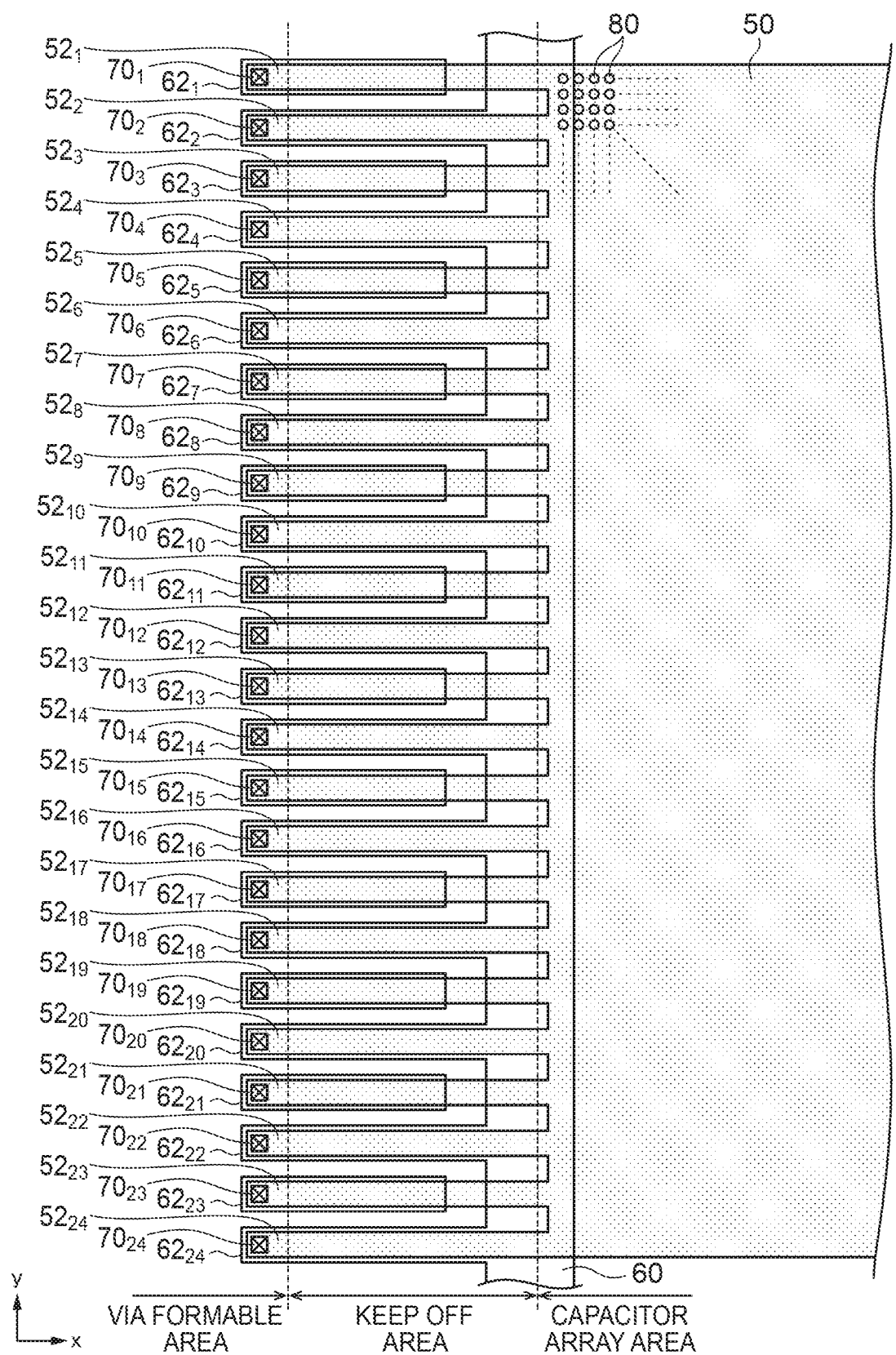
FIGS. 5 to 8 are schematic plan views for explaining states where a resistance component in an ESR unit is set to be twice, three times, four times, and six times that in FIG. 3, respectively.

When the value of the resistance component 42 is changed, one or two or more of the second branch patterns $62_1$ to $62_{24}$ is/are disconnected from the second common pattern 60 by changing a mask pattern for patterning the upper wiring layer. In the example shown in FIG. 5, 12 of the second branch patterns $62_1$, $62_3$, $62_5$, $62_7$, $62_9$, $62_{11}$, $62_{13}$, $62_{15}$, $62_{17}$, $62_{19}$, $62_{21}$, and $62_{23}$ are disconnected from the second common pattern 60 and the remaining 12 second branch patterns $62_2$, $62_4$, $62_6$, $62_8$, $62_{10}$, $62_{12}$, $62_{14}$, $62_{16}$, $62_{18}$, $62_{20}$, $62_{22}$, and $62_{24}$ are connected to the second common pattern 60. With this configuration, the first branch patterns $52_1$, $52_3$, $52_5$, $52_7$, $52_9$, $52_{11}$, $52_{13}$, $52_{15}$, $52_{17}$, $52_{19}$, $52_{21}$, and $52_{23}$ no longer contribute to the resistance component 42. Therefore, the value of the resistance component 42 becomes A/12, and the value of the resistance component 42 can be doubled as compared with the pattern shape shown in FIG. 3. Also, in the example shown in FIG. 5, the second branch patterns 62 connected to the second common pattern 60 and the second branch patterns 62 disconnected from the second common pattern 60 are alternately arranged in the y-direction. Therefore, a current does not concentrate on one point, so that the current can be distributed.

Figure 6:
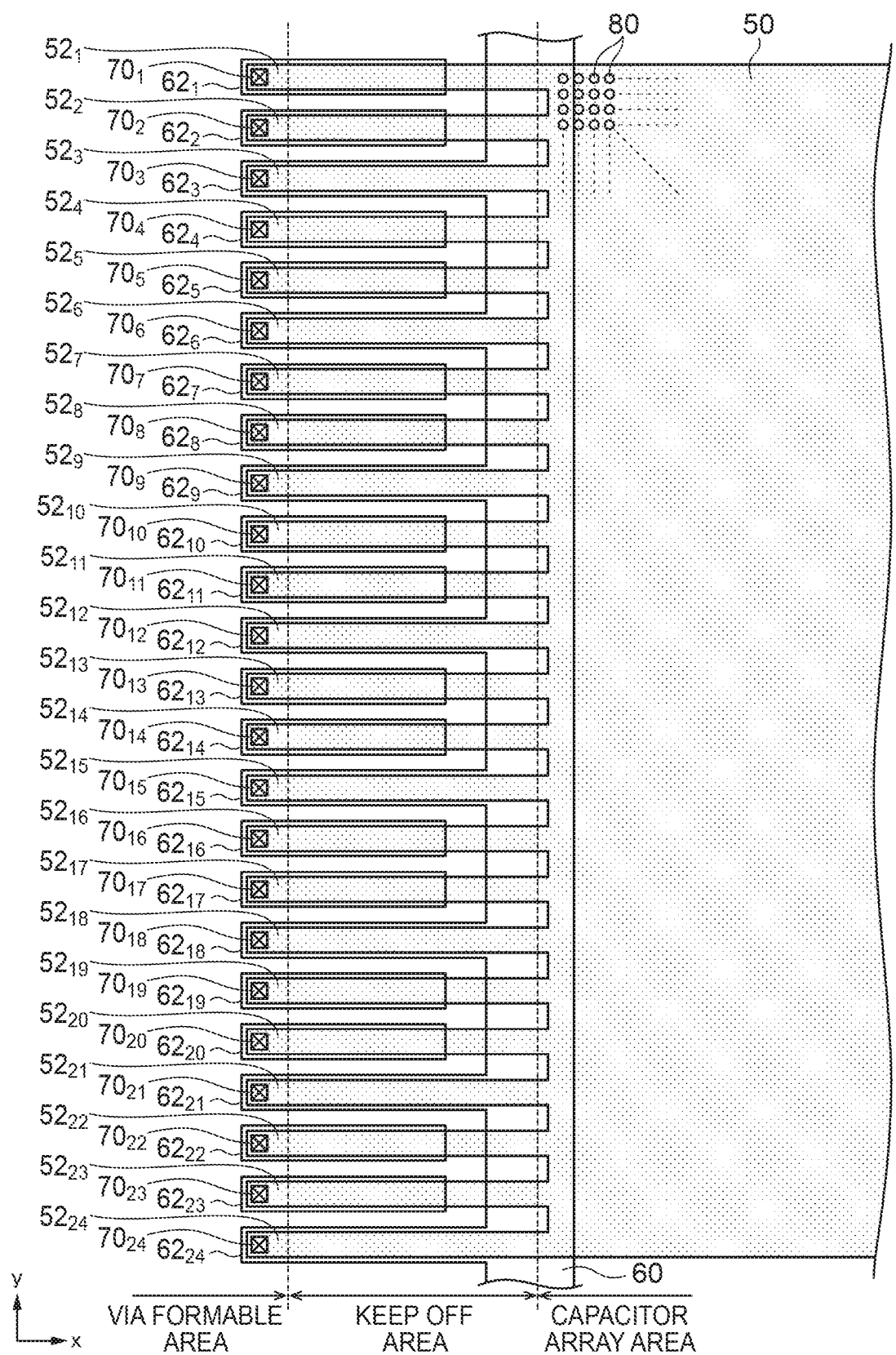

When the value of the resistance component 42 is set to be three times, as shown in FIG. 6, it suffices that 16 of the second branch patterns $62_1$, $62_2$, $62_4$, $62_5$, $62_7$, $62_8$, $62_{10}$, $62_{11}$, $62_{13}$, $62_{14}$, $62_{16}$, $62_{17}$, $62_{19}$, $62_{20}$, $62_{22}$, and $62_{23}$ are disconnected from the second common pattern 60 and the remaining 8 second branch patterns $62_3$, $62_6$, $62_9$, $62_{12}$, $62_{15}$, $62_{18}$, $62_{21}$, and $62_{24}$ are connected to the second common pattern 60. In this case, the value of the resistance component 42 becomes A/8, and the value of the resistance component 42 becomes three times as compared with the pattern shape shown in FIG. 3. Also, in the example shown in FIG. 6, one second branch pattern 62 connected to the second common pattern 60 and two second branch patterns 62 disconnected from the second common pattern 60 are repeatedly arranged in the y-direction. Therefore, a current does not concentrate on one point, so that the current can be distributed.

Figure 7:
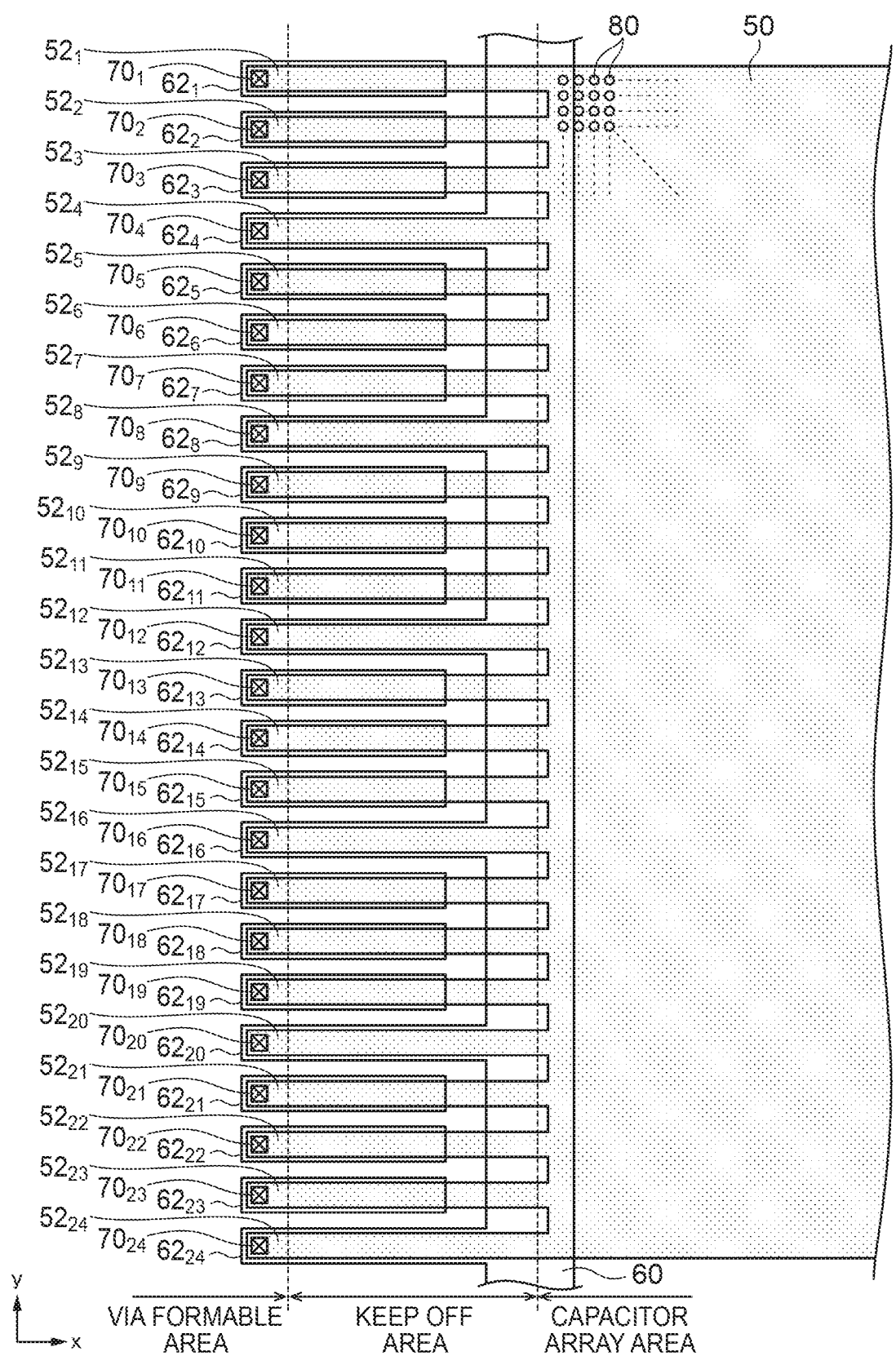

When the value of the resistance component 42 is set to be four times, as shown in FIG. 7, it suffices that 18 of the second branch patterns $62_1$, $62_2$, $62_3$, $62_5$, $62_6$, $62_7$, $62_9$, $62_{10}$, $62_{11}$, $62_{13}$, $62_{14}$, $62_{15}$, $62_{17}$, $62_{18}$, $62_{19}$, $62_{21}$, $62_{22}$, and $62_{23}$ are disconnected from the second common pattern 60 and the remaining 6 second branch patterns $62_4$, $62_8$, $62_{12}$, $62_{16}$, $62_{20}$ and $62_{24}$ are connected to the second common pattern 60. In this case, the value of the resistance component 42 becomes A/6, and the value of the resistance component 42 becomes four times as compared with the pattern shape shown in FIG. 3. Also, in the example shown in FIG. 7, one second branch pattern 62 connected to the second common pattern 60 and three second branch patterns 62 disconnected from the second common pattern 60 are repeatedly arranged in the y-direction. Therefore, a current does not concentrate on one point, so that the current can be distributed.

Figure 8:
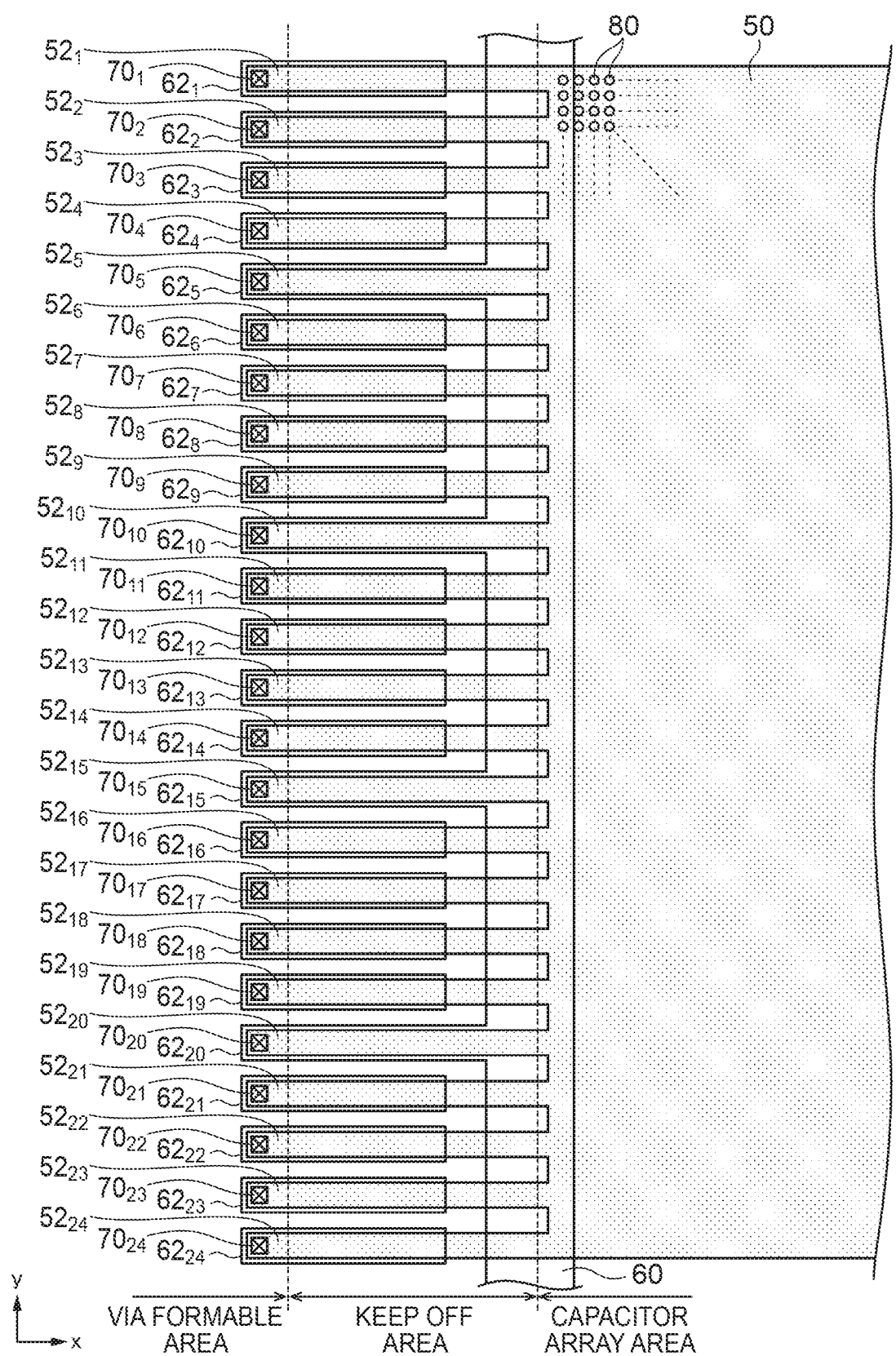

When the value of the resistance component 42 is set to be six times, as shown in FIG. 8, it suffices that 20 of the second branch patterns $62_1$, $62_2$; $62_3$, $62_4$, $62_6$, $62_7$, $62_8$, $62_9$, $62_{11}$, $62_{12}$, $62_{13}$, $62_{14}$, $62_{16}$, $62_{17}$, $62_{18}$, $62_{19}$, $62_{21}$, $62_{22}$, $62_{23}$, and $62_{24}$ are disconnected from the second common pattern 60 and the remaining 4 second branch patterns $62_5$, $62_{10}$, $62_{15}$, and $62_{20}$ are connected to the second common pattern 60. In this case, the value of the resistance component 42 becomes A/4, and the value of the resistance component 42 becomes six times as compared with the pattern shape shown in FIG. 3. Also, in the example shown in FIG. 8, one second branch pattern 62 connected to the second common pattern 60 and four second branch patterns 62 disconnected from the second common pattern 60 are repeatedly arranged in the y-direction. Therefore, a current does not concentrate on one point, so that the current can be distributed.

As described above, in the semiconductor device 10 according to the present disclosure, it is possible to set a value of the resistance component 42 to an arbitrary value in a range from A to A/24 by changing a mask pattern for patterning an upper wiring layer. Further, the value of the resistance component 42 is adjusted by changing the number of parallel connected ones of the first branch patterns $52_1$ to $52_{24}$. Therefore, a current does not concentrate on one point, unlike a method of changing a length of a path that passes through a high-resistance conductor layer. Furthermore, because a portion of the first branch patterns $52_1$ to $52_{24}$ and a portion of the second branch patterns $62_1$ to $62_{24}$ are arranged in the KEEP-OFF area, it is possible to effectively use the KEEP-OFF area where any via conductor cannot be formed. The second common pattern 60 can be formed in the KEEP-OFF area or the capacitor array area.

Figure 9:
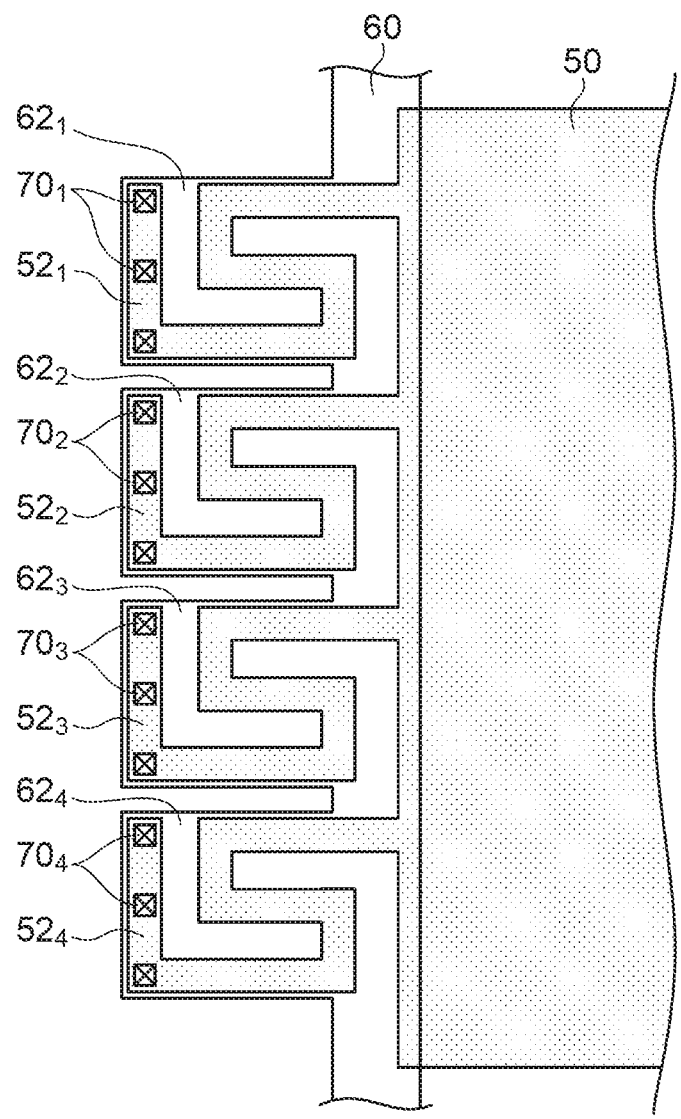
FIG. 9 is a schematic plan view for explaining a configuration of an ESR unit according to a modification.
Figure 10:
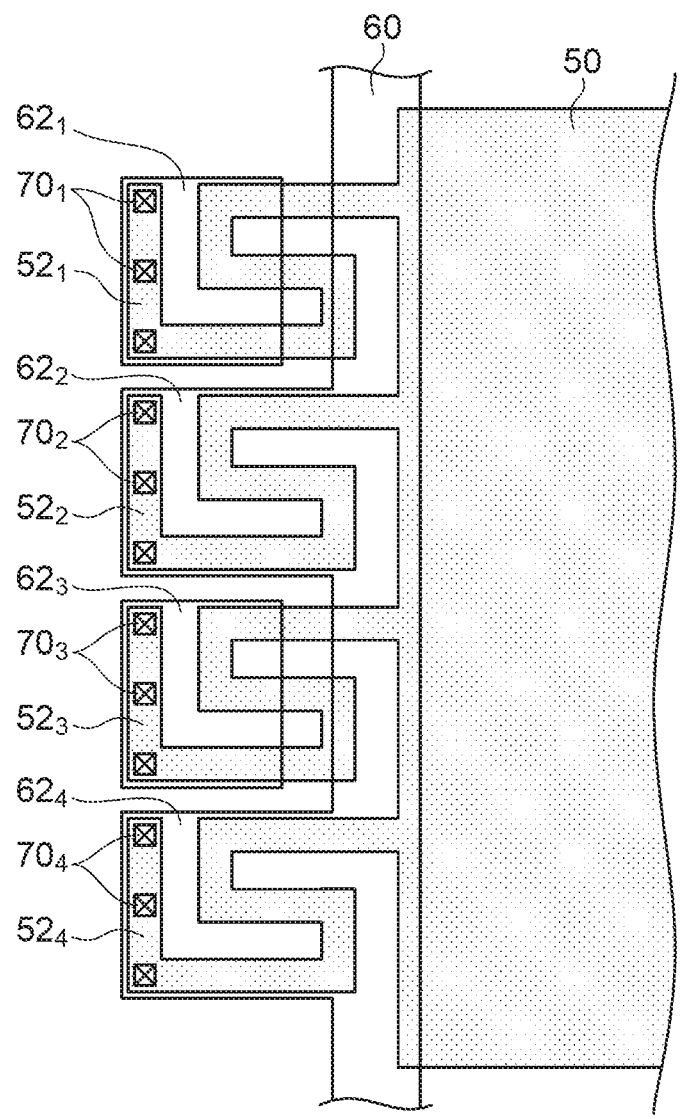
FIG. 10 is a schematic plan view for explaining a state where a value of the ESR unit is set to be twice that in FIG. 9.

FIG. 9 is a schematic plan view showing a shape of the first branch patterns $52_1$ to $52_4$ according to a modification. In the example shown in FIG. 9, each of the first branch patterns $52_1$ to $52_4$ has a meandering shape. Therefore, as compared with a case where the first branch patterns $52_1$ to $52_4$ are straight, it is possible to increase a resistance value of each of the first branch patterns $52_1$ to $52_4$. Further, three via conductors $70_1$, $70_2$, $70_3$, or $70_4$ are assigned to each of the first branch patterns $52_1$ to $52_4$. Therefore, a resistance component caused by the via conductors $70_1$, $70_2$, $70_3$, or $70_4$ is lowered. Accordingly, the resistance component 42 of the ESR unit 40 can be more easily adjusted as designed. Also in this example, it is possible to adjust the resistance component 42 by changing a mask pattern for patterning an upper wiring layer. For example, when two of the second branch patterns $62_1$ and $62_3$ are disconnected from the second common pattern 60 as shown in FIG. 10, the value of the resistance component 42 is doubled as compared with the pattern shape shown in FIG. 9.

The number of the first and second branch patterns 52 and 62 is not specifically limited. However, by preparing a larger number of the first and second branch patterns 52 and 62, it becomes possible to adjust the resistance component 42 more finely. Further, by setting the number of the first and second branch patterns 52 and 62 to a number having as many divisors as possible, it becomes possible to switch the resistance component 42 in multiple levels to integral multiples. For example, when the number of the first and second branch patterns 52 and 62 is 24, the value of the resistance component 42 can be made twice, three times, four times, six times, eight times, 12 times, or 24 times, assuming that a value in a case where all the first branch patterns 52 and all the second branch patterns 62 are connected is a reference. Further, when the number of the first and second branch patterns 52 and 62 is 60, the value of the resistance component 42 can be made twice, three times, four times, five times, six times, 10 times, 12 times, 15 times, 20 times, 30 times, or 60 times, assuming that a value in a case where all the first branch patterns 52 and all the second branch patterns 62 are connected is a reference.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus it is intended that the scope of at least some of the present invention herein disclosed should not be limited by the particular disclosed embodiments described above.

The invention claimed is:

1. An apparatus comprising:
    a first conductive layer having a first common pattern and a plurality of first branch patterns arranged in a first direction, one end of each of the first branch patterns being connected to the first common pattern;
    a second conductive layer having a second common pattern and a plurality of second branch patterns arranged in the first direction, one end of at least one of the second branch patterns being disconnected from the second common pattern;
    an insulating layer formed between the first and second conductive layers; and
    a plurality of via electrodes penetrating through the insulating layer, another end of each of the first branch patterns being connected to an associated one of another end of each of the second branch patterns.

2. The apparatus of claim 1, wherein the one ends of some of the second branch patterns are connected to the second common pattern, and the one ends of remaining second branch patterns are disconnected from the second common pattern.

3. The apparatus of claim 2, wherein the second branch patterns that are connected to the second common pattern are regularly arranged in the first direction.

4. The apparatus of claim 3, wherein at least one of the second branch patterns that is connected to the second common pattern and at least one of the second branch patterns that is disconnected from the second common pattern are alternately arranged in the first direction.

5. The apparatus of claim 1, wherein each of the first branch patterns extends in a second direction substantially perpendicular to the first direction.

6. The apparatus of claim 1, wherein each of the first branch patterns has a meandering shape.

7. The apparatus of claim 2, further comprising a plurality of capacitor elements connected in common to the first common pattern.

8. The apparatus of claim 7, further comprising a plurality of memory cells each having a cell transistor and a cell capacitor,
    wherein each of the capacitor elements has substantially the same structure as the cell capacitor.

9. The apparatus of claim 8,
    wherein the capacitor elements and the memory cells are located in a first area,
    wherein the via electrodes are located in a second area, and
    wherein each of the first and second branch patterns is partially located in a third area between the first and second areas.

10. The apparatus of claim 9, wherein the third area is free from any via electrodes.

11. The apparatus of claim 10, wherein the remaining second branch patterns are disconnected in the third area.

12. The apparatus of claim 9, wherein each of the second branch patterns overlaps with an associated one of the first branch patterns in the third area.

13. The apparatus of claim 12, wherein the second common pattern overlaps with the first common pattern in the first area.

14. The apparatus of claim 1, further comprising an internal voltage generator that generates an internal voltage based on an external voltage supplied from outside,
wherein one of the first and second common patterns is supplied with the internal voltage.

15. The apparatus of claim 1, wherein the first conductive layer comprises a first conductive material, and the second conductive layer comprises a second conductive material different from the first conductive material.

16. The apparatus of claim 15, wherein the first conductive material is greater in resistivity than the second conductive material.

17. The apparatus of claim 16, wherein the first conductive material is a refractory metal.

18. The apparatus of claim 17, wherein the first conductive material includes tungsten.

19. An apparatus comprising:
a plurality of first branch patterns;
a plurality of second branch patterns each overlaps with and connected to an associated one of the plurality of first branch patterns, the second branch patterns being divided into first and second groups;
a first common pattern connected in common to the plurality of first branch patterns; and
a second common pattern connected in common to the second branch patterns belonging to the first group without being connected to the second branch patterns belonging to the second group.

* * * * *